United States Patent
Kimura

(10) Patent No.: US 10,824,285 B2
(45) Date of Patent: Nov. 3, 2020

(54) ELECTRODE STRUCTURE AND METHOD FOR MANUFACTURING THE SAME

(71) Applicant: Wuhan China Star Optoelectronics Semiconductor Display Technology Co., Ltd., Wuhan (CN)

(72) Inventor: Toru Kimura, Shenzhen (CN)

(73) Assignee: WUHAN CHINA STAR OPTOELECTRONICS SEMICONDUCTOR DISPLAY TECHNOLOGY CO., LTD., Wuhan (CN)

( * ) Notice: Subject to any disclaimer, the term of this patent is extended or adjusted under 35 U.S.C. 154(b) by 200 days.

(21) Appl. No.: 16/120,470

(22) Filed: Sep. 4, 2018

(65) Prior Publication Data

US 2019/0243482 A1    Aug. 8, 2019

Related U.S. Application Data

(63) Continuation of application No. PCT/CN2018/079560, filed on Mar. 20, 2018.

(30) Foreign Application Priority Data

Feb. 6, 2018   (CN) .......................... 2018 1 0121437

(51) Int. Cl.
  *B32B 15/04* (2006.01)
  *B32B 17/06* (2006.01)
  (Continued)

(52) U.S. Cl.
  CPC .......... *G06F 3/044* (2013.01); *C23C 14/0036* (2013.01); *C23C 14/083* (2013.01);
  (Continued)

(58) Field of Classification Search
  USPC ........ 428/426, 428, 432, 434, 688, 701, 702
  See application file for complete search history.

(56) References Cited

U.S. PATENT DOCUMENTS 10,198,134 B2 *  2/2019  Du .......................... G06F 3/044
10,411,189 B2 *  9/2019  Kong .................... H01L 51/525
(Continued)

FOREIGN PATENT DOCUMENTS

CN    102375641 A    3/2012
CN    103280501 A    9/2013
(Continued)

OTHER PUBLICATIONS

First Office Action for related International Application No. 201810121437.9 dated Dec. 2, 2019;(6 pages).

*Primary Examiner* — Lauren R Colgan

(57) ABSTRACT

The present disclosure: discloses an electrode structure, and the electrode structure may include: a substrate, an indium tin oxide (ITO) layer, and a metal layer that are stacked sequentially; and a metal oxide adhesive layer disposed between the ITO layer and the metal layer. The present disclosure further discloses a method for manufacturing an electrode structure, which may include: providing a substrate; disposing an indium tin oxide (ITO) layer on the substrate; disposing a metal oxide adhesive layer on the ITO layer; and disposing a metal layer on the metal oxide adhesive layer. In this way, the present disclosure may improve the bonding force between the ITO layer and the metal layer of the electrode structure.

10 Claims, 3 Drawing Sheets

(51) Int. Cl.
*G06F 3/044* (2006.01)
*H01B 1/08* (2006.01)
*H01B 1/02* (2006.01)
*C23C 14/08* (2006.01)
*C23C 14/14* (2006.01)
*C23C 14/00* (2006.01)
*C23C 14/35* (2006.01)

(52) U.S. Cl.
CPC ............ *C23C 14/086* (2013.01); *C23C 14/14* (2013.01); *C23C 14/352* (2013.01); *H01B 1/023* (2013.01); *H01B 1/08* (2013.01); *G06F 2203/04103* (2013.01)

(56) References Cited

U.S. PATENT DOCUMENTS

| | | | |
|---|---|---|---|
| 2009/0266621 A1* | 10/2009 | Huang | G06F 3/044 178/18.01 |
| 2011/0254005 A1* | 10/2011 | Kim | H01L 29/4908 257/59 |
| 2013/0249571 A1 | 9/2013 | Okuno et al. | |
| 2014/0151720 A1* | 6/2014 | Lan | H01L 29/78642 257/79 |
| 2014/0247584 A1* | 9/2014 | Kodama | H02S 40/38 362/183 |
| 2015/0041303 A1* | 2/2015 | Cao | H03K 17/962 200/600 |
| 2015/0253899 A1* | 9/2015 | Yang | G06F 3/044 345/174 |
| 2016/0224151 A1* | 8/2016 | Goto | C23C 14/165 |
| 2017/0097709 A1 | 4/2017 | Guruchandran | |
| 2017/0141076 A1* | 5/2017 | Ito | F21S 2/005 |

FOREIGN PATENT DOCUMENTS

| | | |
|---|---|---|
| CN | 103314068 A | 9/2013 |
| CN | 106155416 A | 11/2016 |
| JP | 20010311954 A | 11/2001 |
| JP | 20042966297 | * 10/2004 |
| WO | WO2013023489 | * 2/2013 |
| WO | WO2013023493 | * 2/2013 |

* cited by examiner

ELECTRODE STRUCTURE AND METHOD FOR MANUFACTURING THE SAME

CROSS-REFERENCE TO RELATED APPLICATIONS

The present application is a continuation-application of International (PCT) Patent Application No. PCT/CN2018/079560 filed on Mar. 20, 2018, which claims foreign priority of Chinese Patent Application No. 201810121437.9, filed on Feb. 6, 2018 in the State Intellectual Property Office of China, the entire contents of which are hereby incorporated by reference.

FIELD OF THE INVENTION

The present disclosure relates to the technical field of display, and more particularly, relates to an electrode structure and a method for manufacturing the same.

BACKGROUND OF THE DISCLOSURE

Touch screens are one kind of input devices, with which interactions between people and computers or other portable mobile devices can be achieved conveniently. In recent years, capacitive touch screens based oil indium tin oxide (ITO) transparent conductive thin films have been widely applied to mobile internet devices e.g., smart phones, portable tablet computers.

Transparent conductive thin films not only require good conductivity, but also require good visible light transmittance. Referring to FIG. 1, to provide better conductivity for the material, a metal layer 30 is disposed by a sputtering film-forming process on an ITO layer 20 to improve the conductive performance for an electrode structure 00 in the related art, and metal protection layers 40, 50 of, a suitable thickness are disposed at two sides of the metal layer 30 to protect the metal layer 30 from being oxidized and corroded. However, with the highly precise and refined development of smart phones, tablet organic light-emitting diode (OLED) display screens, and touch screen panels (TSPs), requirements for making the interface more pleasant to the eyes (e.g., Moires, ITO pattern visibility) are becoming increasingly high. Especially when the devices are made with narrow bezels, the linewidth of the pattern is relatively narrow, which imposes a higher requirement for the bonding force between the ITO layer 20 and the metal layer 30 in the electrode structure 00. When the width of the pattern changes from 10 μm to below 5 μm, the bonding force of the metal layer gets worse after dry and wet etching, which will cause problems such as poor display due to peeling-off of the metal layer 30 from the ITO layer 20 and poor sensitivity of a touch sensor or the like.

SUMMARY OF THE DISCLOSURE

A main technical problem to be solved by the present disclosure is to provide an electrode structure and a method for manufacturing the same, so as to improve the bonding force between an ITO layer and a metal layer in the electrode structure.

To solve the technical problem, one technical solution adopted by the present disclosure is to provide:
an electrode structure, which may include:
a substrate, an indium tin oxide (ITO) layer, and a metal layer which may be stacked sequentially; and
a metal oxide adhesive layer disposed between the ITO layer and the metal layer;
wherein the material of the metal oxide adhesive layer may be a molybdenum niobium (MoNb) oxide, and the thickness thereof may be ranging from 10 nm to 20 nm; and the material of the metal layer may be an aluminum neodymium (AlNd) alloy, and the thickness thereof may be ranging from 270 nm to 330 nm;
a first metal protection layer is disposed between the metal oxide adhesive layer and the metal layer, and a second metal protection layer is disposed on the metal layer.

To solve the technical problem, one technical solution adopted by the present disclosure is to provide:
an electrode structure, which comprises:
a substrate, an indium tin oxide (ITO) layer, and a metal layer which be stacked sequentially; and
a metal oxide adhesive layer disposed between the ITO layer and the metal layer.

To solve the aforesaid technical problem, another technical solution adopted by the present disclosure is to provide:
a method for manufacturing an electrode structure, which may include:
providing a substrate;
disposing an ITO layer on the substrate;
disposing a metal oxide adhesive layer on the ITO layer; and
disposing a metal layer on the metal oxide adhesive layer.

As compared to the prior art, benefits of the present disclosure are as follows: the present disclosure may improve the bonding force between the ITO layer and the metal layer in the electrode structure by disposing the metal oxide adhesive layer between the ITO layer and the metal layer of the electrode structure.

BRIEF DESCRIPTION OF DRAWINGS

Accompanying drawings are for providing further understanding of embodiments of the disclosure. The drawings form a part of the disclosure and are for illustrating the principle of the embodiments of the disclosure along with the literal description. Apparently, the drawings in the description below are merely some embodiments of the disclosure, a person skilled in the art can obtain other drawings according to these drawings without creative efforts.

DETAILED DESCRIPTION OF THE DISCLOSURE

The disclosure will now be described in detail with reference to the accompanying drawings and examples. In the following embodiments, the non-conflicting ones may be combined with each other. It will be apparent that the described embodiments are merely part of the embodiments of the present disclosure rather than all of the embodiments. All other embodiments that can be obtained by those of ordinary skill in the art from the embodiments of the present disclosure without making creative efforts shall fall within the scope of the present disclosure.

Terms "comprising" and "having" as well as any variants thereof used in the specification and the claims as well as the aforesaid attached drawings in the present disclosure are intended to encompass non-exclusive comprising. For example, a process, method, system, product or device comprising a series of steps or units are not necessarily limited to these steps or units that are clearly listed, but may also comprise other steps or units that are not clearly listed or that are inherent to the process, method, products or device.

Figure 1:
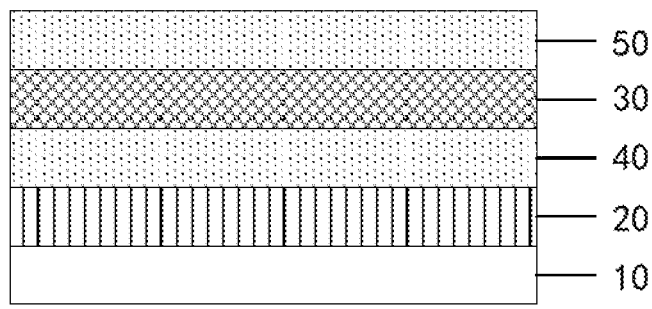
FIG. 1 is a schematic view of an electrode structure in the related art.
Figure 2:
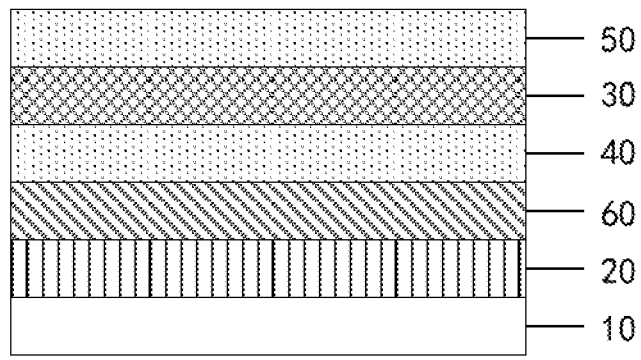
FIG. 2 is a schematic view of an electrode structure according to the present disclosure.

Referring to FIG. 2, which is a schematic view of an electrode structure according to the present disclosure. The electrode structure 00 may include:

a substrate 10, an indium tin oxide (ITO) layer 20, and a metal layer 30 which may be stacked sequentially; and a metal oxide adhesive layer 60 disposed between the ITO layer 20 and the metal layer 30.

The material of the metal oxide adhesive layer 60 may be a molybdenum niobium (MoNb) oxide, and the thickness thereof may be ranging from 10 nm to 20 nm. The material of the metal layer 30 may be an aluminum neodymium (AlNd) alloy, and the thickness thereof may be 300 nm.

A first metal protection layer 40 may be disposed between the metal oxide adhesive layer 60 and the metal layer 30, and a second metal protection layer 50 may be disposed on the metal layer 30.

The material of the first metal protection layer 40 may be a MoNb alloy, and the thickness thereof may be ranging from 30 nm to 40 nm; and the material of the second metal protection layer 50 may be a MoNb alloy, and the thickness thereof may be 50 nm.

In this embodiment, the thickness of the ITO layer 20 may be ranging from 10 nm to 40 nm, and the substrate 10 may be a glass substrate. Other substrates having the same function (e.g., a polyimide substrate, a thin film substrate or the like) may be selected in other embodiments.

Figure 3:
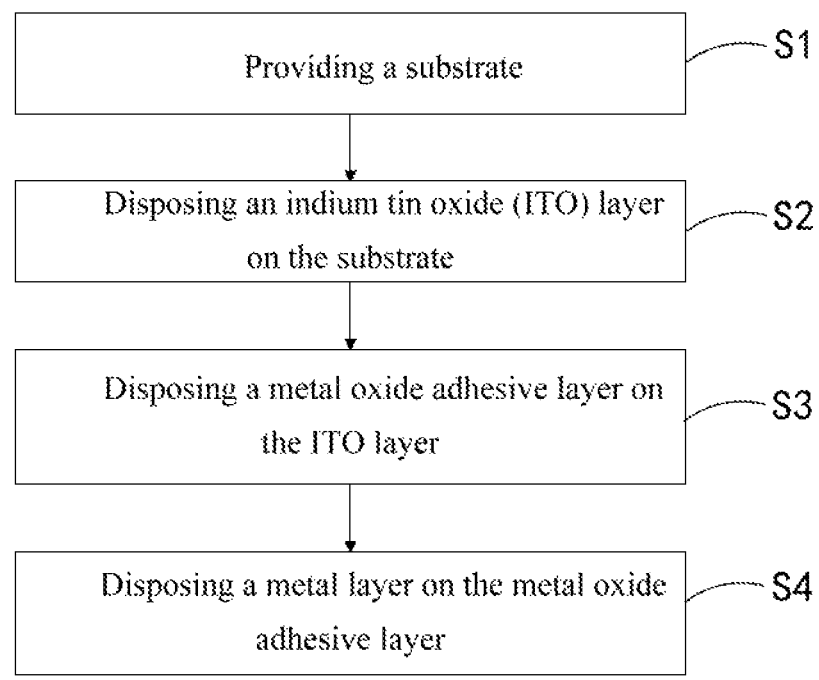
FIG. 3 is a schematic flowchart diagram of a method for manufacturing an electrode structure according to the present disclosure.

Referring to FIG. 3, which is a schematic flowchart diagram of a method for manufacturing an electrode structure according to the present disclosure, the method may include:

S1: providing a substrate.

In this embodiment, the substrate 10 may be a glass substrate. The substrates having the same function (e.g., a polyimide substrate, a thin film substrate, a substrate having an ITO pattern or the like) may be selected in other embodiments.

S2: disposing an indium tin oxide (ITO) layer on the substrate.

The indium tin oxide (ITO) layer may be prepared by physical vapor deposition (PVD) in industry. Basic PVD methods may include vacuum evaporation, sputtering, ion plating or the like, and the ion plating may include hollow cathode ion plating, hot cathode ion plating, arc ion plating, active reaction ion plating, radio frequency (RF) ion plating, direct current (DC) magnetron discharge ion plating or the like.

In this embodiment, the ITO layer 20 may be formed on the substrate 10 by sputtering coating at a thickness of 10 nm to 40 nm.

S3: disposing a metal oxide adhesive layer on the ITO layer.

The metal material in the metal oxide adhesive layer 60 may be any one or a combination of at least two of metals that are capable of forming solid solution with ITO, e.g., molybdenum niobium oxide (MoNbOx). The metal oxide adhesive layer 60 may form a stress film (a stress relieving film) to relieve the stretch stress and the compression stress during the film forming process, such that the adhesion between the ITO and the metal film may be improved.

The metal film may be generally coated by using DC magnetron sputtering and MF magnetron sputtering. In this embodiment, a MoNbOx adhesive layer 60 may be disposed on the ITO layer 20 by DC magnetron sputtering film forming. The specific condition may be as follows: the MoNbOx adhesive layer 60 may be formed by DC magnetron sputtering film forming at a thickness of 10 nm to 20 nm in a film forming chamber with a vacuum degree below $4 \times 10^{-5}$ Pa, argon with 5%~20% oxygen added thereto, a pressure of 0.2 Pa to 1 Pa, a target material of a MoNb alloy (Nb occupies 10% of the alloy), and a voltage of 0.5 kW to 3 kW.

S4: disposing a metal layer on the metal oxide adhesive layer.

The metal material of the metal layer 30 may be any one or a combination of at least two of conductive metals, e.g., an AlNd alloy.

A first metal protection layer 40 may be disposed between the metal oxide adhesive layer 60 and the metal layer 30, and a second metal protection layer 50 may be disposed on the metal layer 30.

The metal material of the first metal protection layer 40 and the second metal protection layer 50 may be any one or a combination of at least two of oxidation-resisting and corrosion-resisting metals, e.g., a MoNb alloy.

In this embodiment, the metal layer 30 (e.g., an AlNd alloy layer) may be disposed on the MoNbOx adhesive layer 60 by using DC magnetron sputtering film forming. Specifically, the first metal protection layer 40 (e.g., a MoNb alloy layer) may be disposed between the MoNb oxide adhesive layer 60 and the metal layer 30 (an AlNd alloy), and the second metal protection layer 50 (e.g., a MoNb alloy layer) may be disposed on the metal layer 30 (the AlNd alloy). The specific condition may be as follows: the first metal protection layer 40 (the MoNb alloy) may be formed at a thickness of 30 nm to 40 nm by DC magnetron sputtering in a film forming chamber with a vacuum degree below $4 \times 10^{-5}$ Pa, a pressure of 0.2 Pa to 1 Pa, a target material of a MoNb alloy (Nb occupies 10% of the alloy), and a voltage of 1 kW to 5 kW. The metal layer 30 (the AlNd alloy) may be formed at a thickness of 300 nm by DC magnetron sputtering under a condition including a vacuum degree below $4 \times 10^{-5}$ Pa, a pressure of 0.2 Pa to 1 Pa, a target material of an AlNd alloy (Nd occupies 1% of the alloy), and a voltage of 1.5 kW to 10 kW. The second metal protection layer 50 (the MoNb alloy) may be formed at a thickness of 50 nm by DC magnetron sputtering under a condition including a vacuum degree below $4 \times 10^{-5}$ Pa, a pressure of 0.2 Pa to 1 Pa, a target material of a MoNb alloy (Nb occupies 10% of the alloy), and a voltage of 1.5 kW to 8 kW.

Figure 4:
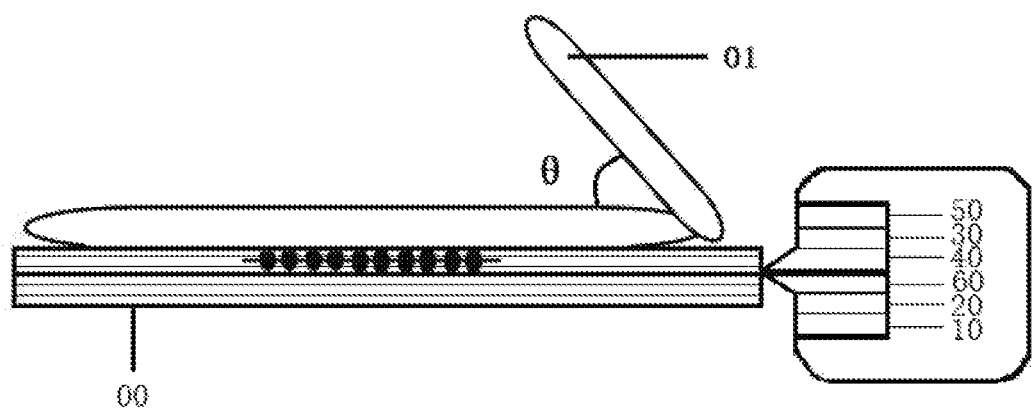
FIG. 4 is a schematic view illustrating test of bonding force of the electrode structure according to the present disclosure.

Please referring to FIG. 4, which is a schematic view illustrating test of bonding force of the electrode structure according to the present disclosure.

Cross cut test is a commonly used method for testing the bonding force of a film layer, and it utilizes a tool (which is usually a cross-cut tester) to scribe, with a force right penetrating through the film layer, two lines crossing with each other on a to-be-tested sample to form 100 cells of 10×10. Then, debris on the surface of the to-be-tested sample is removed by using a soft brush, and a tape of a suitable length is attached on the side of the to-be-tested sample that is scribed with the cells, and then the tape is pressed with the fingers to remove the air. After a certain period of time, the other end of the tape is held by the hand to rapidly tear off the tape with an angle of included between the tape and the to-be-tested sample, and the adhesion degree of the film layer to the substrate is evaluated by assessing the integrity of the film layer within the cells.

Figure 5:
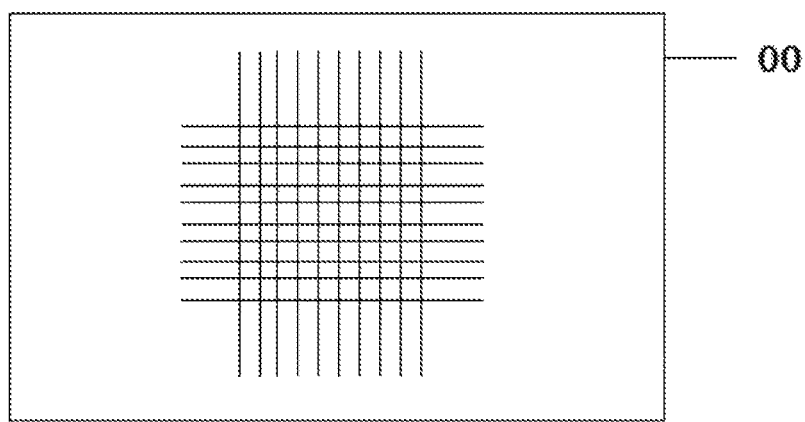
FIG. 5 is a schematic view illustrating cross cut test on a surface of the electrode structure according to the present disclosure.

Specifically, the test for bonding force applied to the electrode structure of the present disclosure is as follows:

Experimental group: an electrode structure 00 of the present disclosure may be taken as an experimental sheet 1, and 100 cells of 10×10 may be scribed on the electrode structure 00 as the experimental sheet 1 (as shown in FIG. 5). A tape 01 having a width of 30 mm and a length of 75 mm may be taken and attached on a side of the to-be-tested sample that is scribed with the cells, and then the tape may be pressed with the fingers to remove the air. Within 5 minutes after the attachment, one end of the tape 01 may be held by the hand to intensively tear off the tape within a time of 0.5 s to 1.0 s with an angle of nearly 60° included between the tape 01 and the electrode structure 00 as the experimental sheet 1, and the falling-off of the film layer on the cell region of the experimental sheet 2 may be observed.

Control group: an electrode that does not have the MoNbOx adhesive layer 60 between the ITO layer 20 and the metal layer 30 (the AlNd alloy) the prior art is taken as the experimental sheet 2, and other test conditions are the same as those of the experimental group, and finally the falling-off of the film layer on the cell region of the experimental sheet 2 is observed.

The film layer on the cell region of the experimental sheet 2 of the control group falls off, i.e., the electrode structure 00 that does not have the MoNbOx adhesive layer 60 between the ITO layer 20 and the metal layer 30 (the AlNd alloy) in the prior art peels of due to the insufficient bonding force between the ITO layer 20 and the metal layer 30 (the AlNd alloy) in the cross-cut test. However, the film layer on the cell region of the experimental sheet 1 of the experimental group does not fall off, i.e., the MoNbOx adhesive layer 60 in the electrode structure 100 of the present disclosure may improve the bonding force between the ITO layer 20 and the metal layer 30 (the AlNd alloy).

In the present disclosure, an AlNd oxide adhesive layer may be disposed between the ITO layer and the AlNd alloy layer of the electrode structure, and the metal oxide adhesive layer may be formed by DC magnetron sputtering film forming under a condition including a vacuum degree below $4\times10^{-5}$ Pa, argon with 5%~20% oxygen added thereto, a pressure of 0.2 Pa to 1 Pa, a target material of a MoNb alloy (Nb occupies 10% of the alloy), and a voltage of 0.5 kW to 3 kW. A first metal protection layer (MoNb alloy) may be disposed between the AlNd oxide adhesive layer and the AlNd alloy layer, and a second metal protection layer (MoNb alloy) may be disposed on the AlNd alloy layer. The first metal protection layer (MoNb alloy) may be formed by DC magnetron sputtering film forming under a condition including a vacuum degree below $4\times10^{-5}$ Pa, a pressure of 0.2 Pa to 1 Pa, a target material of a MoNb alloy (Nb occupies 10% of the alloy), and a voltage of 1 kW to 5 kW. The AlNd alloy may be formed by DC magnetron sputtering film forming under a condition including a vacuum degree below $4\times10^{-5}$ Pa, a pressure of 0.2 Pa to 1 Pa, a target material of an AlNd alloy (Nd occupies 1% of the alloy), and a voltage of 1.5 kW to 10 kW. The second metal protection layer (MoNb alloy) may be formed by DC magnetron sputtering film forming under a condition including a vacuum degree below $4\times10^{-5}$ Pa, a pressure of 0.2 Pa to 1 Pa, a target material of a MoNb alloy (Nb occupies 10% of the alloy), and a voltage of 1.5 kW to 8 kW. In this way, the present disclosure may improve the bonding force between the ITO layer and the AlNd alloy layer, thereby preventing poor display due to the peeling-off of the AlNd alloy layer from the ITO layer as well as poor sensitivity of the touch sensor or the like.

The foregoing are merely embodiments of the present disclosure, and is not intended to limit the scope of the present disclosure. Any equivalent structure or flow transformation made based on the specification and the accompanying drawings of the present disclosure, or any direct or indirect applications of the disclosure on other related fields, shall all be covered within the protection of the present disclosure.

What is claimed is:

1. An electrode structure, comprising:
   a substrate, an indium tin oxide (ITO) layer, and a metal layer which are stacked sequentially; and
   a metal oxide adhesive layer disposed between the ITO layer and the metal layer;
   wherein the material of the metal oxide adhesive layer is a molybdenum niobium (MoNb) oxide, and the thickness thereof is ranging from 10 nm to 20 nm; and the material of the metal layer is an aluminum neodymium (AlNd) alloy, and the thickness thereof is ranging from 270 nm to 330 nm; and
   a first metal protection layer is disposed between the metal oxide adhesive layer and the metal layer, and a second metal protection layer is disposed on the metal layer.

2. An electrode structure, comprising:
   a substrate, an indium tin oxide (ITO) layer, and a metal layer which are stacked sequentially; and
   a metal oxide adhesive layer disposed between the ITO layer and the metal layer;
   wherein the material of the metal oxide adhesive layer is a molybdenum niobium (MoNb) oxide, and the material of the metal layer is an aluminum neodymium (AlNd) alloy; and
   a first metal protection layer is disposed between the metal oxide adhesive layer and the metal layer.

3. The electrode structure of claim 2, wherein the material of the metal oxide adhesive layer is a molybdenum niobium (MoNb) oxide, and the thickness thereof is ranging from 10 nm to 20 nm.

4. The electrode structure of claim 2, wherein the material of the metal layer is an aluminum neodymium (AlNd) alloy, and the thickness thereof is ranging from 270 nm to 330 nm.

5. The electrode structure of claim 2, wherein the first metal protection layer is disposed between the metal oxide adhesive layer and the metal layer, and a second metal protection layer is disposed on the metal layer.

6. The electrode structure of claim 5, wherein the material of the first metal protection layer is a MoNb alloy, and the thickness thereof is ranging from 20 nm to 50 nm; and the material of the second metal protection layer is a MoNb alloy, and the thickness thereof is ranging from 30 nm to 70 nm.

7. The electrode structure of claim 5, wherein a direct current (DC) magnetron sputtering film-forming condition of the metal oxide adhesive layer comprises a vacuum degree below 4×10-5 Pa, argon with 5%~20% oxygen added thereto, a pressure of 0.2 Pa to 1 Pa, a target material of a MoNb alloy (Nb occupies 10% of the alloy), and a voltage of 0.5 kW to 3 kW.

8. The electrode structure of claim 5, wherein a DC magnetron sputtering film-forming condition of the first metal protection layer comprises a vacuum degree below $4\times10^{-5}$ Pa, a pressure of 0.2 Pa to 1 Pa, a target material of a MoNb alloy (Nb occupies 10% of the alloy), and a voltage of 1 kW to 5 kW.

9. The electrode structure of claim 5, wherein a DC magnetron sputtering film-forming condition of the metal layer comprises a vacuum degree below $4\times10^{-5}$ Pa, a pressure of 0.2 Pa to 1 Pa, a target material of an AlNd alloy (Nd occupies 1% of the alloy), and a voltage of 1.5 kW to 10 kW.

10. The electrode structure of claim 5, wherein a DC magnetron sputtering film-forming condition of the second metal protection layer comprises a vacuum degree below $4\times10^{-5}$ Pa, a pressure of 0.2 Pa to 1 Pa, a target material of a MoNb alloy (Nb occupies 10% of the alloy), and a voltage of 1.5 kW to 8 kW.

\* \* \* \* \*